United States Patent [19]
Lee et al.

[11] Patent Number: 5,262,670
[45] Date of Patent: Nov. 16, 1993

[54] VERTICALLY STACKED BIPOLAR DYNAMIC RANDOM ACCESS MEMORY

[75] Inventors: Jin-Hyo Lee; Kyu-Hong Lee; Dae-Yong Kim; Won-Gu Kang, all of Daejeon, Rep. of Korea

[73] Assignee: Korea Electronics and Telecommunications Research Institute, Rep. of Korea

[21] Appl. No.: 666,248

[22] Filed: Mar. 8, 1991

[30] Foreign Application Priority Data

Nov. 6, 1990 [KR] Rep. of Korea .................. 90-17909

[51] Int. Cl.$^5$ ............................................. H01L 27/02
[52] U.S. Cl. .................................. 257/577; 257/535; 257/574; 257/906
[58] Field of Search ................... 357/34, 51; 257/535, 257/574, 577, 906

[56] References Cited

U.S. PATENT DOCUMENTS 4,538,244 8/1985 Sugo et al. .......................... 357/34
5,126,814 6/1992 Nakamura et al. .................. 357/34

Primary Examiner—Edward Wojciechowicz
Attorney, Agent, or Firm—Evenson, McKeown, Edwards & Lenahan

[57] ABSTRACT

A bipolar DRAM comprises a switching transistor, a storage capacitor and a substrate. The switching transistor and the storage capacitor are vertically stacked with each other. The switching transistor is preferably an NPN bipolar transistor. The switching transistor preferably comprises P$^-$ base region, an N$^+$ emitter region of the substrate, a N$^+$ collector region, with a lower epitaxial layer between the N$^+$ emitter region and P$^-$ base region, and an upper epitaxial layer between the P$^-$ base region and N$^+$ collector region. The storage capacitor comprises a storage electrode formed on the N$^+$ collector region, a dielectric layer and a plate electrode. The dielectric layer and the plate electrode are vertically and sequentially stacked on the storage electrode. A bit line is formed on the plate electrode, and a word line is formed on the side surface of the P$^+$ base region.

4 Claims, 10 Drawing Sheets

VERTICALLY STACKED BIPOLAR DYNAMIC RANDOM ACCESS MEMORY

FIELD OF THE INVENTION

The present invention relates to a bipolar dynamic random access memory (DRAM), wherein a storage capacitor is formed vertically over a switching transistor.

BACKGROUND OF THE INVENTION

Generally, the high integration of a DRAM has been achieved through the development of fabrication equipment and processing technology of semiconductor devices, designing techniques, memory cell structure, etc.

However, there have been many problems in developing highly integrated memory devices due to the physically imposed limitations consisting in the semiconductor fabrication equipment and semiconductor device itself.

For example, in order to achieve a highly integrated memory device the area for the storage capacitor should be as small as possible. However, in a conventional memory structure where a storage capacitor and a switching transistor are arranged horizontally, makes it substantially impossible to reduce the areas for the capacitor and transistor, due to the physically imposed limitations, but also requires a precision configuration/layout by semiconductor fabrication equipment, in order to achieve a highly integrated memory device. Furthermore, the processing technology such as a precision configuration/layout technique is itself very difficult to develop due to inherent technical limitations.

FIG. 1a illustrates a cross sectional view of the structure of a conventional DRAM, wherein a switching transistor and storage capacitor are horizontally arranged, and FIG. 1b is an equivalent circuit of FIG. 1a. Referring to FIG. 1a, 40 and 41 respectively represent the drain and source (or source and drain) of the transistor Q shown in FIG. 1b that are formed on silicon substrate 10. The reference numeral 60 represents the contact between bit line B1 and the diffusion region 40 forming the drain or source. The reference numeral 20 represents an insulating layer for isolating the bit line B1 from word line W13. The word lines W10, W11, ... and electrode PE are made of polysilicon, and the bit line B1 are made of aluminum.

In an N-channel MOSFET (metal-oxide-semiconductor field effect transistor), the storage capacitor Co is formed between channel 50 and the electrode PE applied is with a high voltage. In this case, if a pulse voltage is applied to the word line W10, the transistor Q, comprising the drain 40 and source 41 connected between the word line W10 and bit line B1, conducts current, so that the voltage stored in the storage capacitor Co is read out and divided by the bit line B1 and the capacitance of the storage capacitor Co.

More specifically, when the word line W10 is applied with a voltage in order to write data into the conventional DRAM cell, the transistor Q conducts current by the voltage applied to its gate, so that the data loaded in the bit line B1 (i.e., voltage of "1" or "0" level) is stored through the conducting transistor Q into the storage capacitor Co.

On the other hand, one electrode of the capacitor Co is the plate electrode applied with a constant reference voltage, while the other electrode, which is a storage electrode, maintains the voltage stored in the capacitor Co. The voltage of the bit line B1 may be sufficiently written into the capacitor, provided that the voltage of the word line W10 exceeds than the voltage of the bit line B1 by a threshold voltage.

In order to read out the data stored in the capacitor, the bit line B1 is precharged with the reference voltage, and the pulse voltage is applied to the word line W10, so that the transistor Q conducts current, so as to deliver the data stored in the capacitor to the bit line. At this time, the bit line undergoes a small voltage variation that is amplified to readable data.

A typical stacked type conventional DRAM is specifically illustrate in FIG. 1c, wherein the reference numeral 10 represents silicon substrate 10, 40 and 41 respectively the drain and source (or source and drain) of the transistor Q as shown in FIG. 1a, and B1 and W10 respectively the bit and word lines. The storage capacitor consists of plate electrode PE, storage electrode SE, and dielectric layer DE. This kind of conventional DRAM is disclosed in U.S. Pat. Nos. 4,044,340 issued on Aug. 23, 1977, 3,876,992, 3,979,734, 4,190,466, etc.

In such conventional DRAMs, the areas for the switching transistor and capacitor are large, and the bit line B1 and the plate electrode of the capacitor are separated from each other, so that the process for fabricating contacts, etc. of the memory is complicated, thus making it impossible to achieve a highly integrated memory. In addition, since the transfer transistor consists of a MOS transistor that has a lower current drive capability than a bipolar transistor, its operating speed is somewhat slower.

SUMMARY OF THE INVENTION

It is an object of the present invention to provide a bipolar DRAM that is highly integrated by vertically stacking a switching transistor and a storage capacitor with each other so as to reduce the area for a fundamental cell.

It is another object of the present invention to provide a bipolar DRAM that uses, an NPN bipolar transistor as the switching transistor, so as to increase operating speed.

According to the present invention, there is provided a bipolar DRAM comprising a switching transistor, a storage capacitor and a substrate, characterized in that the switching transistor and storage capacitor are vertically stacked with each other. The switching transistor is preferably an NPN bipolar transistor.

In one aspect of the present invention, the switching transistor preferably comprises P− base region, an N+ emitter region of the substrate, an N+ collector region, a lower epitaxial layer between the N+ emitter region and P− base region, and an upper epitaxial layer between the P− base region and N+ collector region. The storage capacitor comprises a storage electrode formed on the N+ collector region, a dielectric layer and a plate electrode. The dielectric layer and the plate electrode are vertically and sequentially stacked on the storage electrode. A bit line is formed on the plate electrode, and a word line is formed on a side surface of the P+ base region.

The present invention will now be described more specifically with reference to the drawings attached only by way of example.

BRIEF DESCRIPTION OF THE ATTACHED DRAWINGS

FIG. 1b is an equivalent circuit of the DRAM shown in FIG. 1a;

DETAILED DESCRIPTION

The processing steps of the inventive method for fabricating a DRAM of a novel stacked structure are largely divided into two groups, of which the one is to form a witching NPN bipolar transistor (the steps from FIG. 2a to FIG. 2p) and the other to form a storage capacitor (the steps from FIG. 2q to FIG. 2v).

Figure 2A:
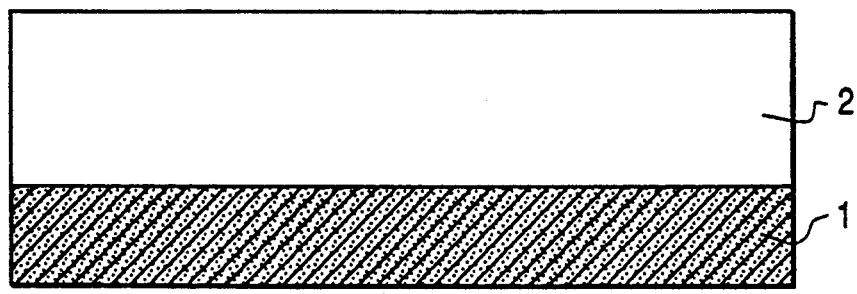
FIGS. 2a to 2v illustrate the processing steps of the inventive method for fabricating a DRAM having a novel stacked structure.

Referring to FIG. 2a, $N^-$ epitaxial layer 2 is grown on $N^+$ substrate 1 with the thickness of about 1 μm.

Figure 2B:
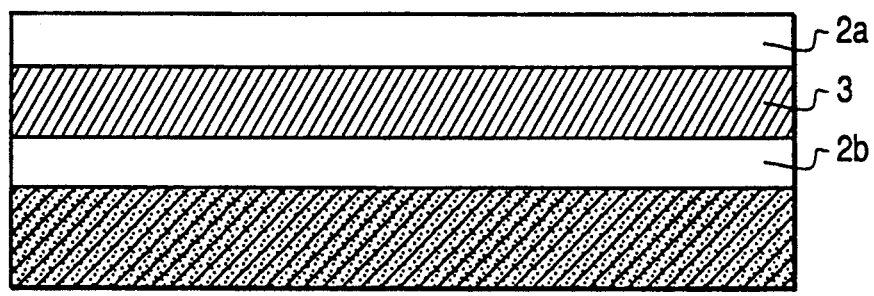
Figure 2C:
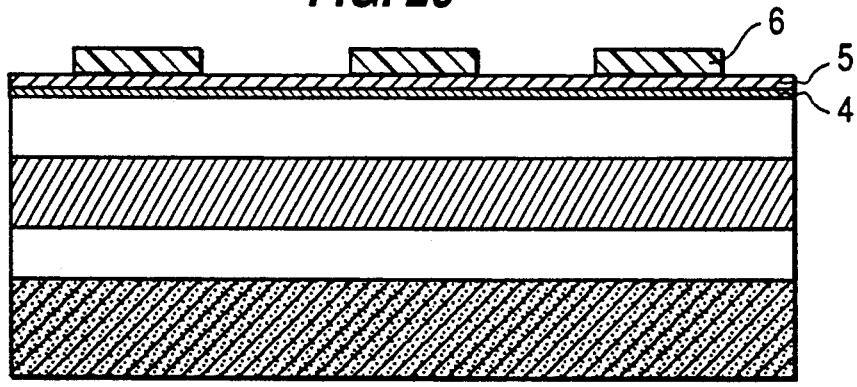
Figure 2D:
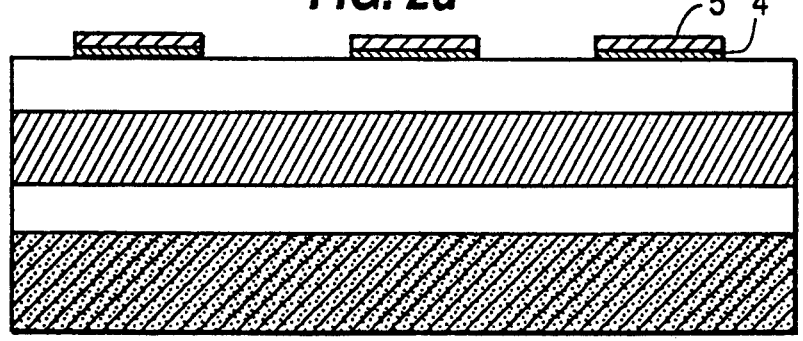

Referring to FIG. 2b for illustrating the forming of the base region of the NPN transistor in the $N^-$ epitaxial layer 2, boron ions are deeply implanted into the $N^-$ epitaxial layer 2 with the depth of about 0.4 μm so as to form $P^-$ region 3 which is the base region of the NPN transistor.

At this time, the $N^-$ epitaxial layer 2 is divided into an upper $N^-$ epitaxial layer 2a and a lower $N^-$ epitaxial layer 2b by the interposition of the $P^-$ region 3, which epitaxial layers 2a and 2b serve to respectively reduce the junction leakage and capacitance between the base and collector, and the base and emitter.

FIGS. 2c to 2f illustrate the forming of a first spacer after defining field and active regions. A nitride layer 4 and oxide layer 5 are sequentially deposited over the $N^-$ epitaxial layer 2, and then a trench masking layer 6 is formed on the epitaxial layer 2 so as to define the active and field regions.

By using the trench masking layer 6 the oxide and nitride layers 5 and 4 are sequentially patterned, thus defining active and field regions. Then the masking layer 6 is removed. In this case, the portions on which the oxide and nitride layers 5 and 4 are etched are field regions, and the portions on which they are not etched are active region.

Figure 2E:
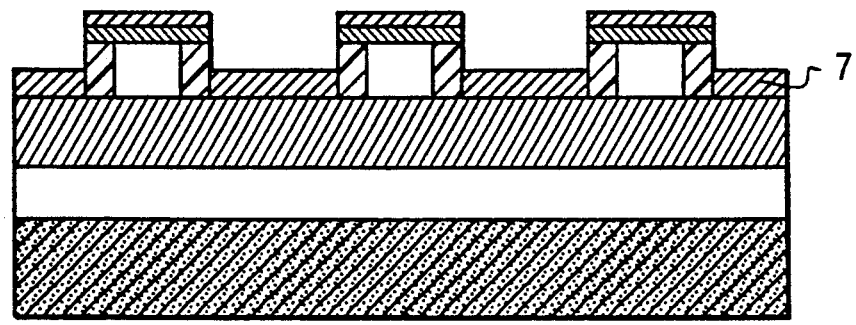

Referring to FIG. 2e, the oxide and nitride layers 5 and 4 serve as a masking layer to anisotropically dry-etch the $N^-$ epitaxial layer 2a on the $P^-$ region 3 in the field region.

Figure 2F:
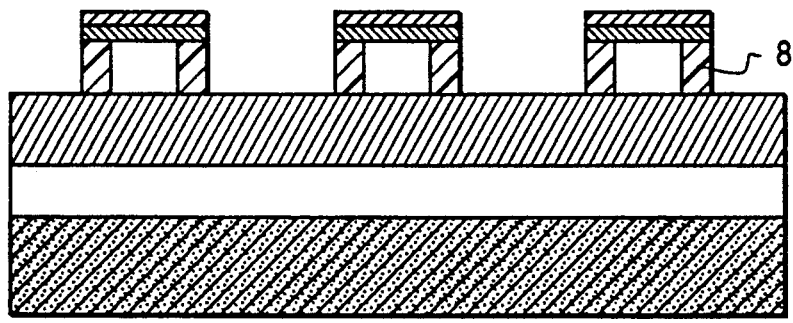
Figure 2G:
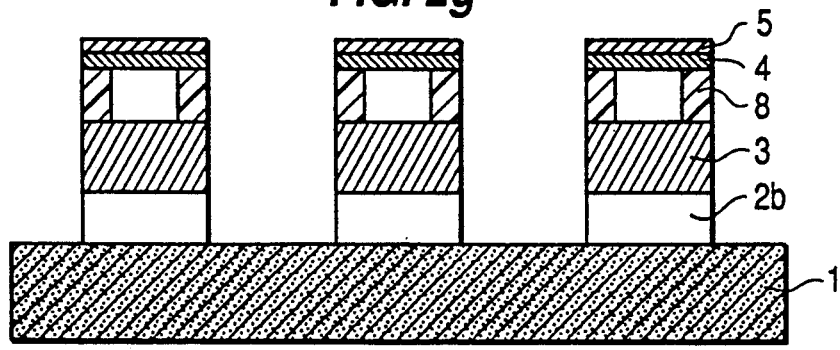

After etching the upper epitaxial layer 2a, an oxide layer 7 is grown on the whole surface of the substrate with the thickness of 1000 A, and anisotropically dry-etched to form the first spacer 8 on the side surfaces of the $N^-$ epitaxial layer 2a, as shown in FIG. 2f.

Figure 2H:
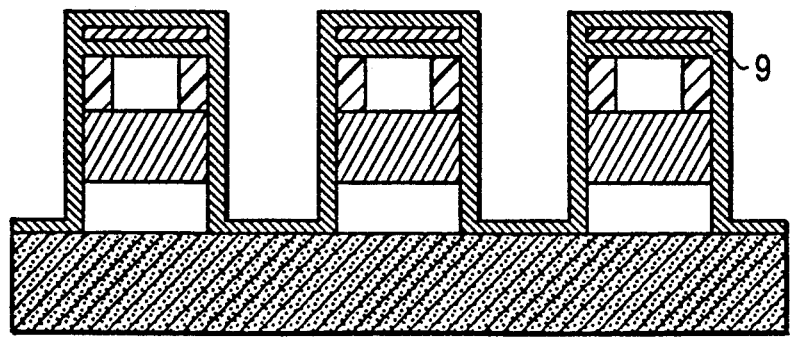
Figure 2I:
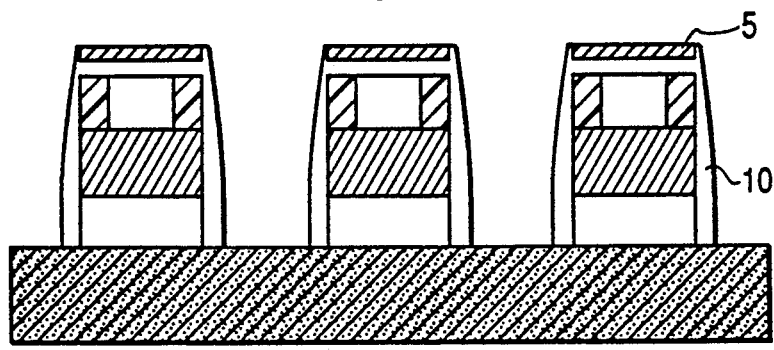
Figure 2J:
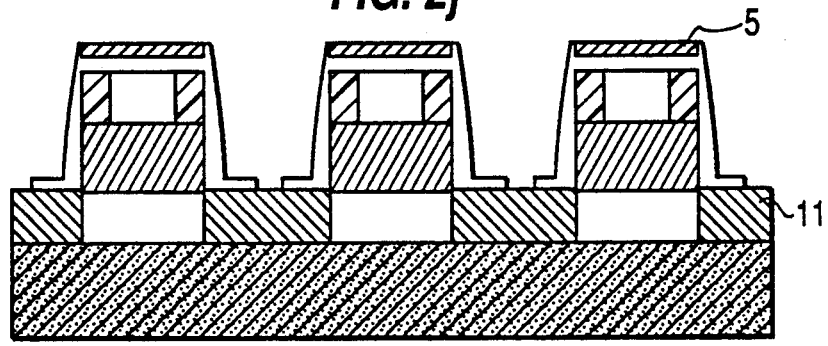
Figure 2K:
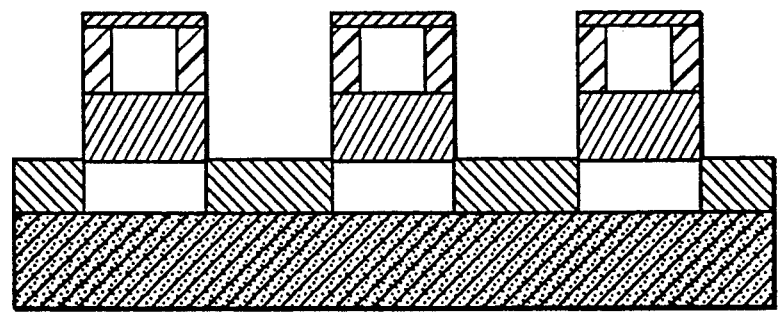

FIGS. 2g to 2k illustrate the forming of field oxide layer after a second spacer. The oxide and nitride layers 5 and 4 and the first spacer 8 serve as a masking layer to anisotropically dry-etch the $P^-$ region 3 and the $N^-$ epitaxial layer 2b beneath it to the substrate 1. Then a nitride layer 9 is vapor-deposited on the whole surface of the substrate as shown in FIG. 2h, and anisotropically dry-etched to form a second spacer 10 as shown in FIG. 2h. Referring to FIG. 2j, an isolation field oxide layer 11 is formed on the field region, and the second spacer 10 and oxide layers 5 are sequentially removed as in FIG. 2k.

Figure 2L:
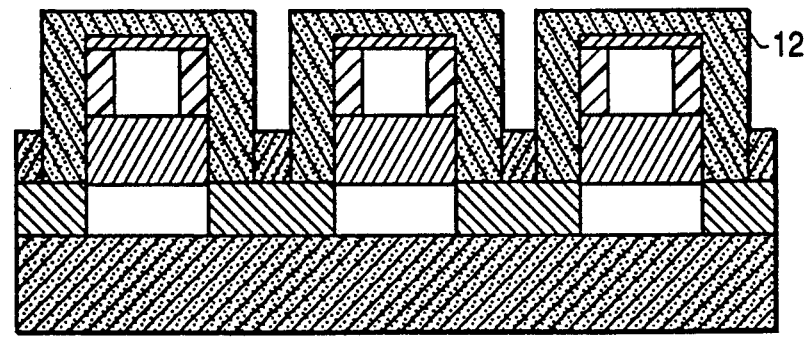
Figure 2M:
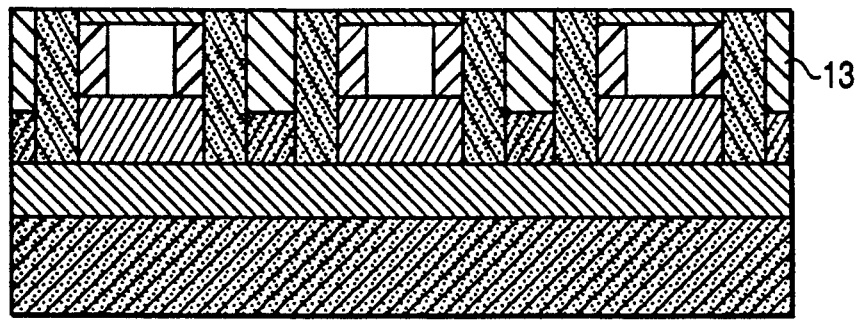
Figure 2N:
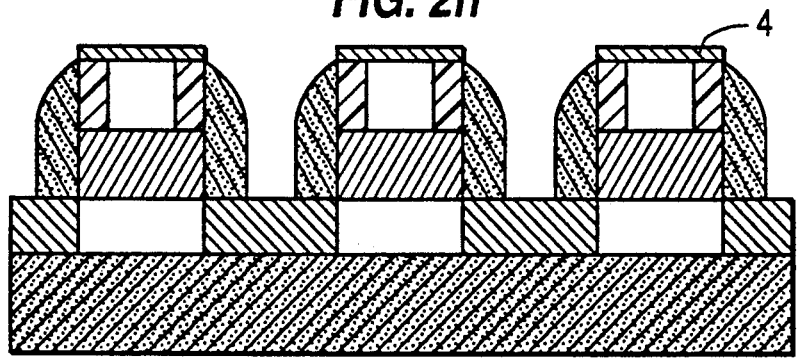

FIGS. 2l to 2o illustrate the forming of the word line. Firstly a $P^+$ polysilicon layer 12 is vapor-deposited as shown in FIG. 2l, on which is laid a photoresist layer 13 as shown in FIG. 2m. Then the upper portions of the polysilicon layer 12 and photoresist layer 13 are dry-etched to the nitride layer 4 so as to flatten or planarize the substrate. After removing the photoresist 13, the polysilicon layer 12 is dry-etched by using a word line masking layer so as to define a word line as shown in FIG. 2n. The word line may be formed of a refractory metal instead of the $P^+$ polysilicon layer 12.

Figure 2O:
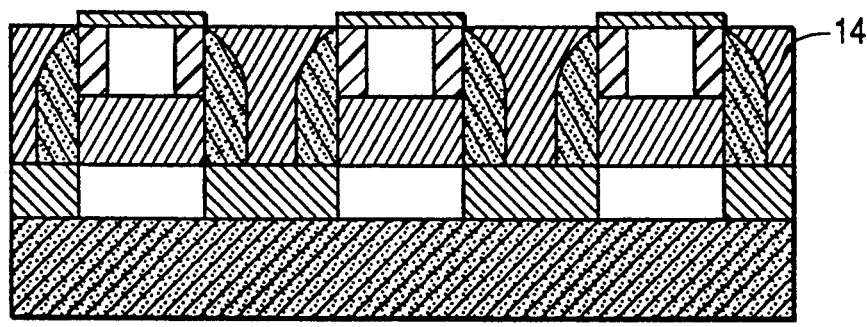

As shown in FIG. 2o, an insulating layer 14 is used to again flatten the substrate. A CVD (chemical vapor deposition) oxide layer may be used as the insulating layer.

Figure 2P:
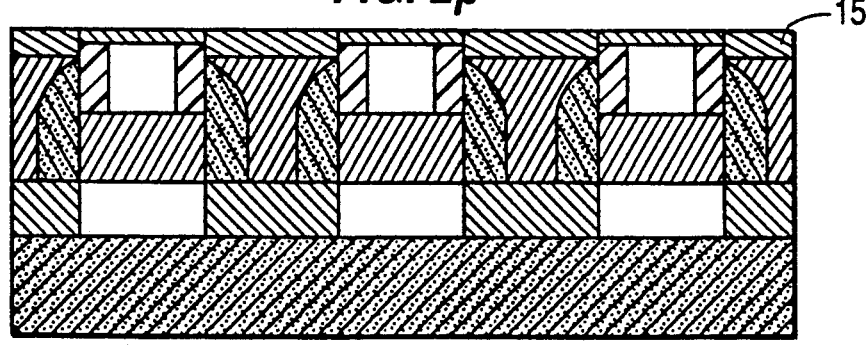
Figure 2Q:
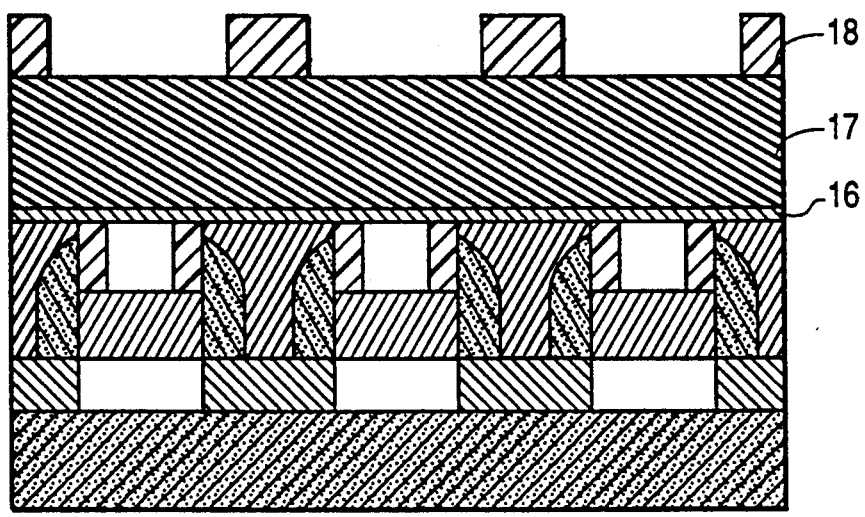

After flattening the substrate, an oxide layer 15 of about 2000 A is grown to provide self-contact between storage node and the collector of the transistor, and all the remaining nitride layer is removed, as shown in FIG. 2p.

Figure 2R:
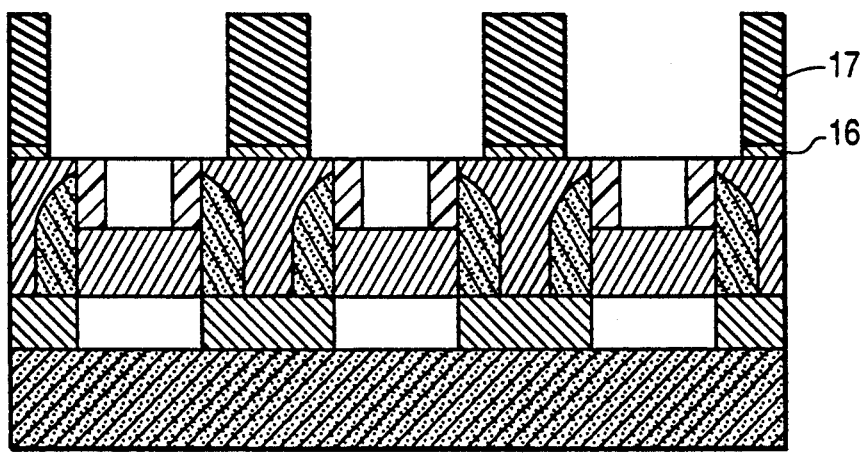

Referring to 2q, a nitride layer 16 and insulating layer 17 such as an oxide layer are sequentially formed over the whole surface of the substrate. Then, by using a storage masking layer 18, the insulating layer 17 and nitride layer 16 are etched so as to form the capacitor, as shown in FIG. 2r.

Figure 2S:
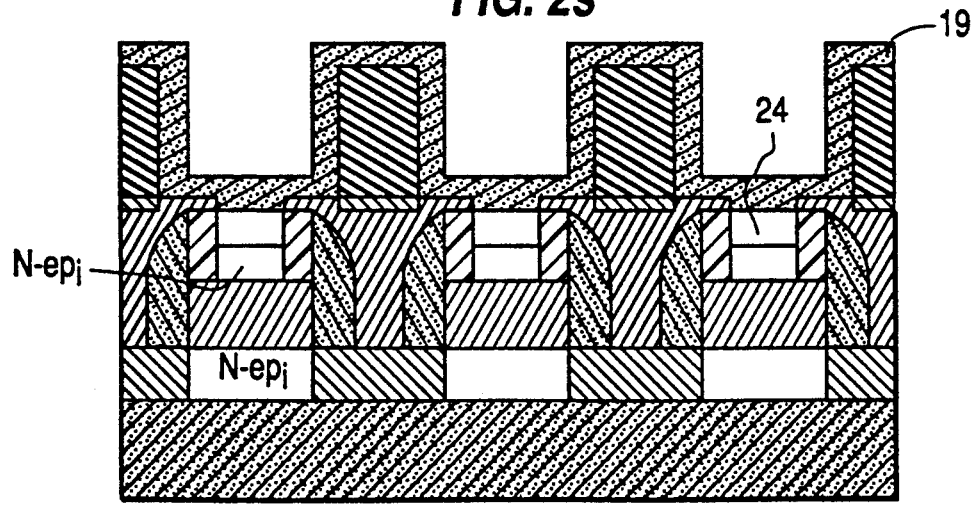
Figure 2T:
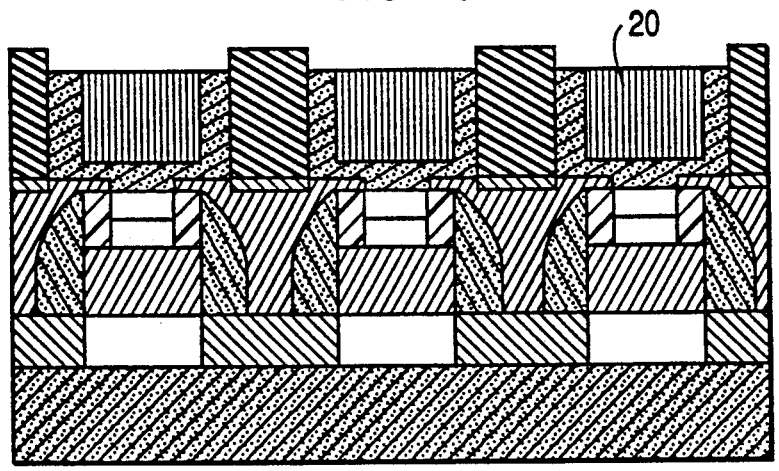

FIGS. 2S to 2T illustrate the forming of the storage node. An $N^+$ polysilicon layer 19 for the storage node is formed on the whole surface of the substrate, into which As, etc. is implanted diffused, so as to form an $N^+$ collector 24. After depositing a photoresist layer 20 thereon, the upper portions of the polysilicon layer 19 and photoresist layer 20 are dry-etched to flatten the surface of the substrate as shown in FIG. 2t.

Figure 2U:
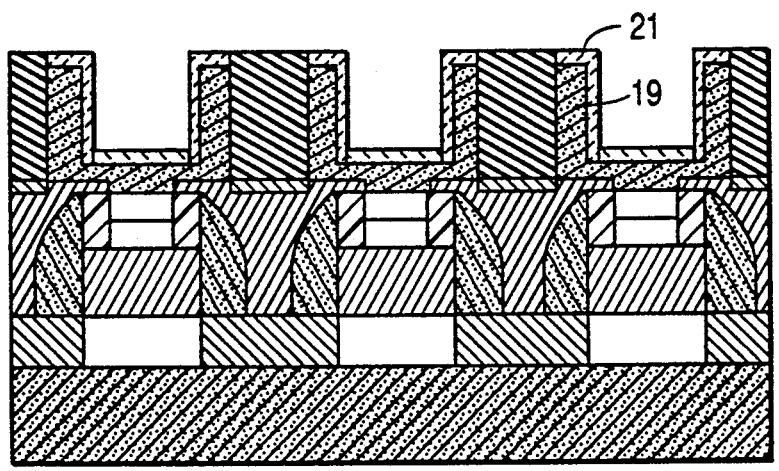
Figure 2V:
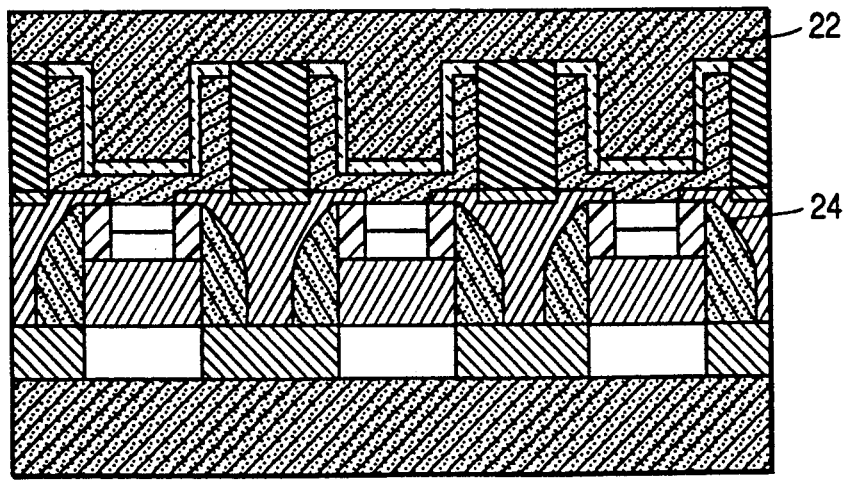

Referring to FIGS. 2u and 2v, on the $N^+$ polysilicon layer 19 for the storage node are sequentially formed the capacitor dielectric layer 21 and polysilicon layer 22 for the plate electrode.

Figure 4A:
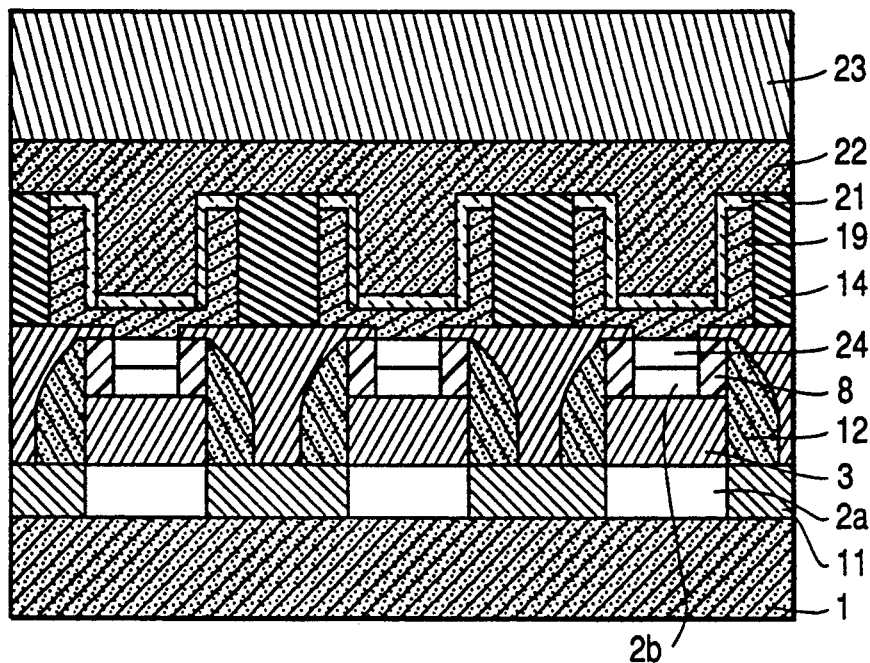
FIG. 4a and 4b are respectively cross sectional views taken along lines A-A' and B-B' of FIG. 3.
Figure 4B:
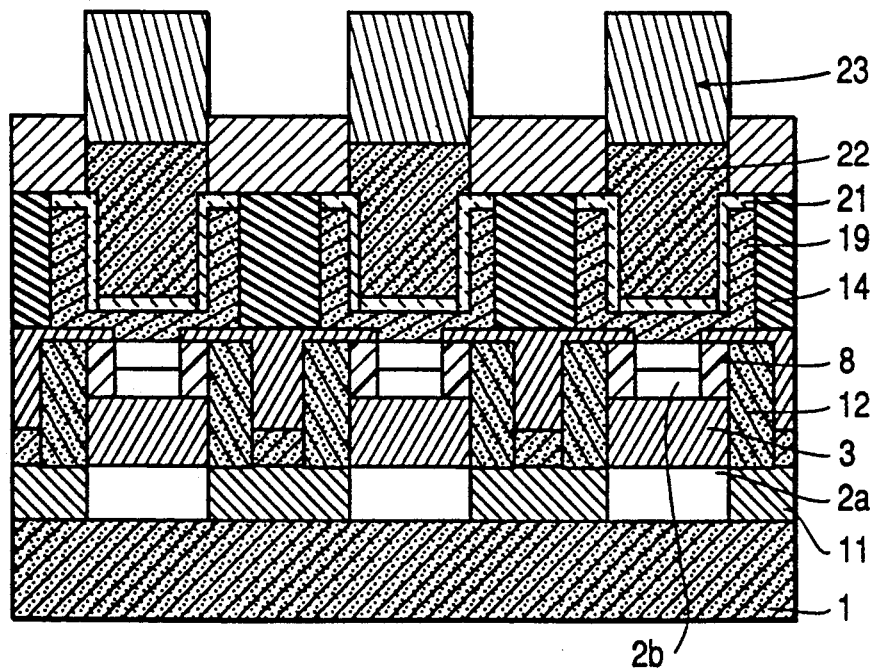

Finally, a metal such as aluminium is deposited on the whole surface of the substrate to define bit line 23, so that there may be obtained a DRAM, wherein a capacitor and a transistor are vertically stacked according to the present invention, as shown in FIGS. 4a and 4b.

Figure 3:
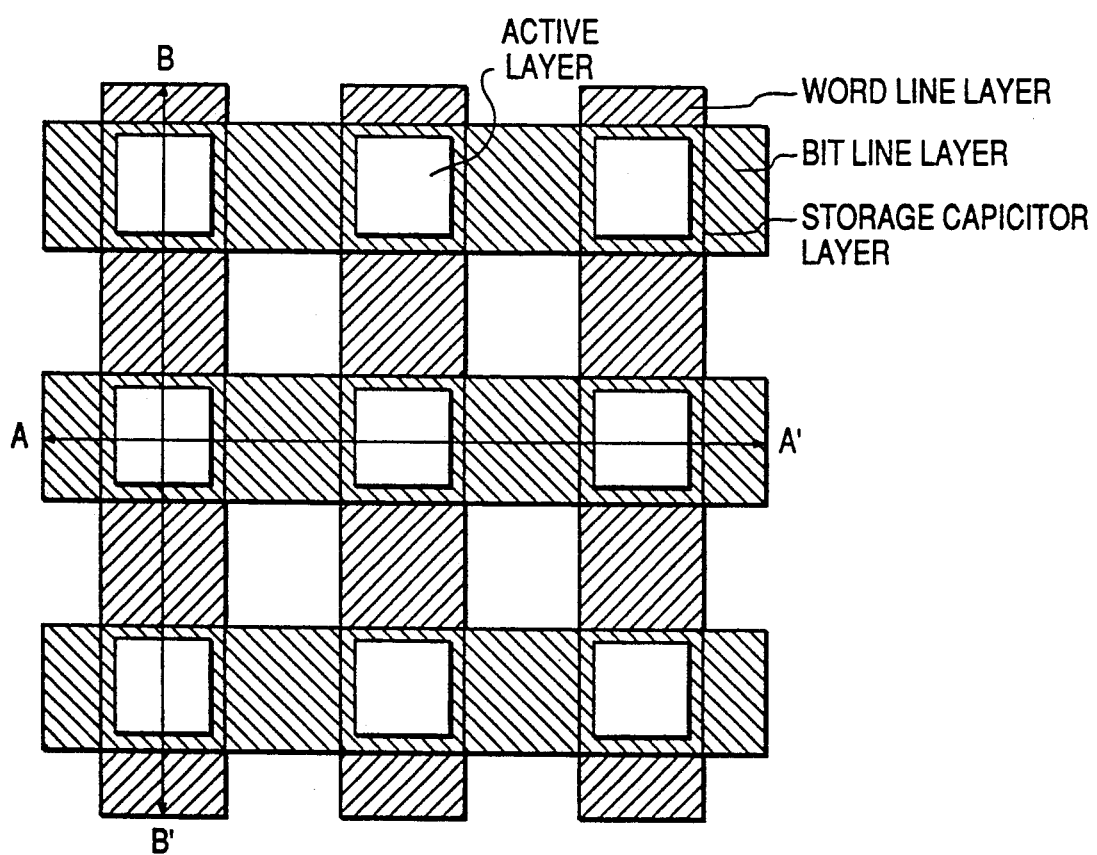
FIG. 3 is a plan view of a DRAM of a novel stacked structure fabricated according to the inventive method.

FIG. 3 illustrates a layout of a plurality of the inventive bipolar DRAM cells arranged matrix-like fabricated by the process as shown in FIG. 2. FIG. 4a is a cross sectional view taken along line A-A' of FIG. 3 in the direction of the bit line, and FIG. 4b taken along line B-B' of FIG. 3 in the direction of the word line.

Referring to FIGS. 3 to 4b, the inventive bipolar DRAM comprises the bipolar transistor of the active region and storage capacitor vertically stacked with each other. The $N^+$ substrate 1, $P^+$ region 3 and $N^+$ are respectively the emitter, base and collector regions of the switching bipolar NPN transistor. The N polysilicon layer 19, dielectric layer 21 and $N^+$ polysilicon layer 22 respectively represent the storage electrode, dielectric layer and plate electrode of the storage capacitor.

On the other hand, the P polysilicon layer 12 directly contacting with the side surface of the $P^+$ region 3 of the base is the word line, and the metal layer 23 formed on the N polysilicon layer 22 of the plate electrode is the bit line.

The structural characteristics of the inventive DRAM are as follows:

First, since the field oxide layer 11 is formed after etching the isolation region of the bipolar transistor, i.e., the P+ region 3 and N− epitaxial region 2a in the field region, in a trench type, as shown in FIG. 2, the active region of the transistor has an island-like form.

Second, the collector region 24 of the bipolar transistor and the word line 12 are isolated from each other by the first spacer 8, and the base region 3 directly contacts the word line 12 in the direction of the word line.

Third, atop the collector region 24 of the bipolar transistor is storage electrode 19 of the capacitor, on which a the dielectric layer 21 and plate electrode 22 are sequentially arranged, so that a switching bipolar transistor and a storage capacitor are vertically stacked.

Fourth, in order to reduce the junction capacitance between the base region 3 and emitter region 1, and the base region 3 and collector region 24 of the bipolar transistor, a P− impurity is doped into the N− epitaxial layer 2 so as to form the P− base region, so that the N− region 2a is formed between the base region 3 and collector region 24, and the N− region 2b between the base region 3 and emitter region 1.

Fifth, a switching bipolar transistor and a storage capacitor are vertically stacked, and the bit line 23 is directly formed on the plate electrode 22.

Figure 1A:
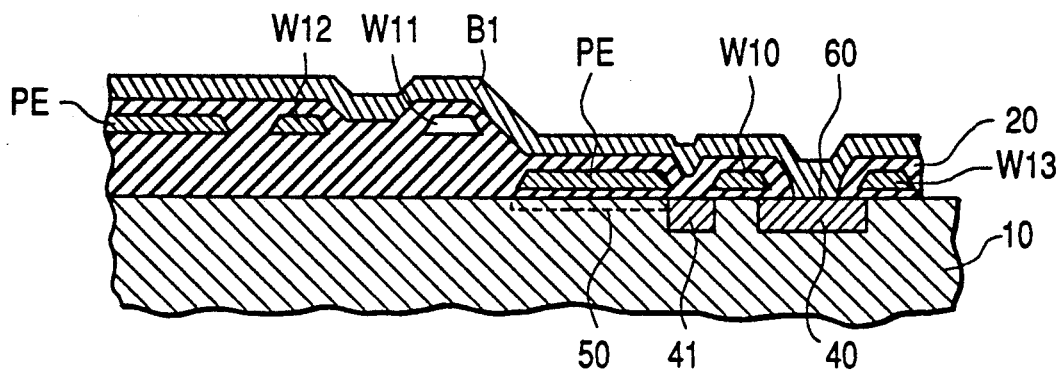
FIG. 1a is a cross sectional view of a conventional DRAM of the horizontal structure.
Figure 1B:
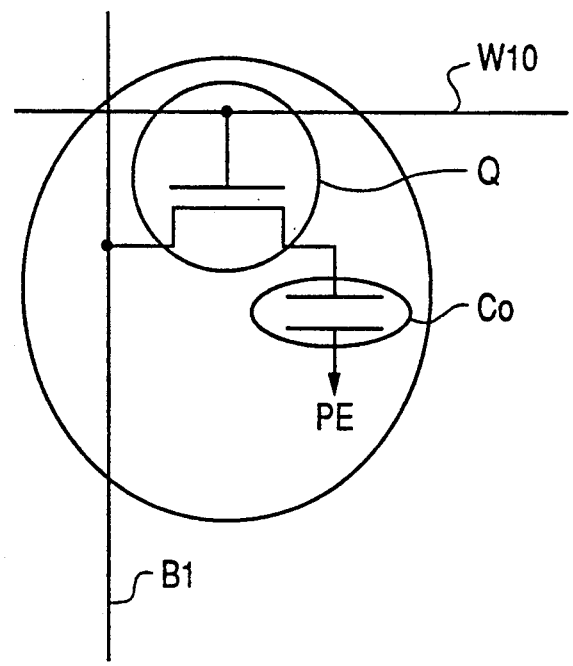
Figure 1C:
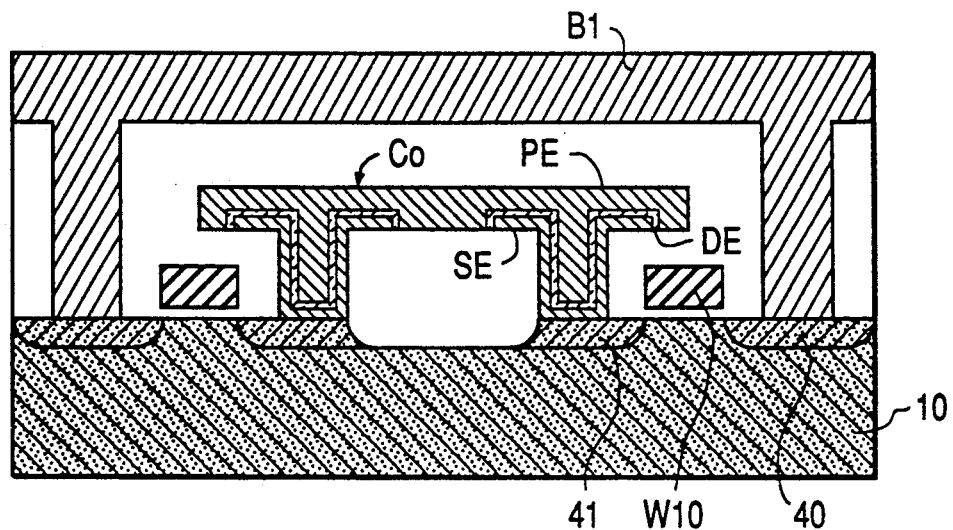
FIG. 1c is a cross sectional view of a conventional DRAM of stacked structure.
Figure 5:
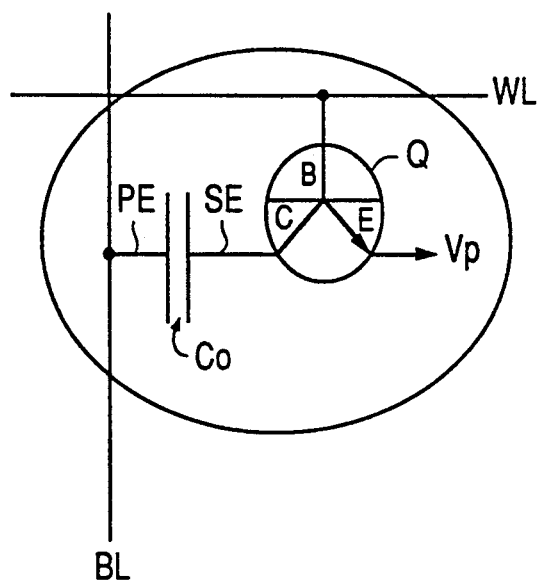
FIG. 5 is an equivalent circuit of a DRAM of a novel structure according to the present invention.

FIG. 5 is an equivalent circuit of the inventive DRAM of FIGS. 4a and 4b. The emitter region E of the switching NPN bipolar transistor Q is applied with the reference voltage, the base region B being connected to the word line WL, the collector region to the storage electrode SE of the storage capacitor Co, and the plate electrode PE to the bit line BL.

Hereinafter will now be described the operation of the inventive DRAM.

When storing data, a voltage is applied to the word line WL so as to make the switching transistor Q conduct, and the bit line BL is applied with "0" V or "power supply voltage" $V_{DD}$ according to whether the storage data is "0" or "1", thus storing the data corresponding to the storage capacitor Co. At this time, the emitter of the switching bipolar transistor maintains the constant reference voltage Vp.

Next, when reading out data, the bit line BL is precharged with the reference voltage, and a voltage is applied to the word line WL so as to turn on the bipolar transistor Q, so that the storage electrode 7 of the storage capacitor Co becomes to have the same reference voltage Vp as the emitter voltage, and therefore the voltage of the bit line BL experiences a small variation that is amplified so as to be readable. Furthermore, the using of the bipolar transistor improves the current driving capability, thus increasing the operating speed.

Thus, the present invention gives the following advantages:

1. The bit line is connected to the plate electrode of the storage capacitor, the storage electrode is formed on the collector of the switching bipolar transistor, and the word line directly contacts with the side surface of the base, so that the switching transistor and storage capacitor are vertically stacked with each other, thus decreasing the area of the memory cell.

2. Since the area occupied by the fundamental memory cell may be reduced within a given design rule, there may be obtained a highly integrated DRAM.

3. Since the bipolar transistor is used as the switching transistor, the operating speed is increased.

4. The plane area occupied by the fundamental memory cell is small, and the base region of the bipolar transistor serves as a potential barrier against alpha-particles, so that adverse effects caused by alpha-particles are reduced.

5. The bit line is used together with the plate electrode of the storage capacitor, so that the fabrication process of a DRAM cell is facilitated so as to produce a highly integrated memory device with high speed.

What is claimed is:

1. A bipolar DRAM (dynamic random access memory) in which a switching transistor and a storage capacitor are vertically stacked with each other, said DRAM comprising:

a semiconductor substrate employed as an emitter region of said transistor;

a first impurity layer of a first conductivity type formed on said semiconductor substrate, and being electrically isolated from another impurity layer of said first conductivity type formed on said semiconductor substrate by a field oxide layer therebetween;

a base region of a second conductivity type formed on said first impurity layer and forming a first laminate structure with said first impurity layer;

a second impurity layer of said first conductivity type formed on said base region;

a collector region formed on said second impurity layer thereby forming a second laminate structure with said second impurity layer;

first and second spacers, respectively formed along side-walls of said laminate structure of said second impurity layer and said collector region;

first and second word lines respectively formed along sidewalls of a third laminate structure comprised of said base region and said first and second spacers;

a first storage node of said capacitor formed on said collector region, electrically isolated with a second storage node by an insulating layer therebetween;

a dielectric layer formed on a surface of said first storage node; and a plate electrode formed on said dielectric layer and said insulating layer.

2. A bipolar DRAM, according to claim 1, wherein said collector region and said wordline are separated from one another by said first spacer.

3. A bipolar DRAM, according to claim 1, wherein said first spacer is formed of an oxide layer.

4. A bipolar DRAM, according to claim 1, wherein said base region has a contact connected to said wordline at a side surface thereof.

* * * * *